US011751422B2

(12) United States Patent
Watanabe

(10) Patent No.: US 11,751,422 B2
(45) Date of Patent: Sep. 5, 2023

(54) DISPLAY DEVICE AND METHOD FOR MANUFACTURING DISPLAY DEVICE

(71) Applicant: SHARP KABUSHIKI KAISHA, Sakai (JP)

(72) Inventor: Noriko Watanabe, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 248 days.

(21) Appl. No.: 17/042,829

(22) PCT Filed: Mar. 28, 2018

(86) PCT No.: PCT/JP2018/013001
§ 371 (c)(1),
(2) Date: Sep. 28, 2020

(87) PCT Pub. No.: WO2019/186836
PCT Pub. Date: Oct. 3, 2019

(65) Prior Publication Data
US 2021/0028398 A1 Jan. 28, 2021

(51) Int. Cl.
*H10K 50/844* (2023.01)
*H10K 59/131* (2023.01)
*H10K 59/12* (2023.01)

(52) U.S. Cl.
CPC ....... *H10K 50/844* (2023.02); *H10K 59/1201* (2023.02); *H10K 59/131* (2023.02)

(58) Field of Classification Search
CPC ............. H01L 51/5253; H01L 51/0031; H01L 51/5256; H01L 27/1244; H01L 27/3276; H01L 2227/323; H10K 50/844; H10K 50/8445; H10K 59/131; H10K 59/1201; H10K 71/70; G09F 9/30
See application file for complete search history.

(56) References Cited

U.S. PATENT DOCUMENTS

| | | | |
|---|---|---|---|
| 2003/0164674 A1 | 9/2003 | Imamura | |
| 2011/0318889 A1 | 12/2011 | Chida | |
| 2015/0053955 A1* | 2/2015 | Furuie | H10K 59/124 257/40 |
| 2017/0133441 A1* | 5/2017 | Yoo | H10K 50/856 |
| 2017/0301280 A1* | 10/2017 | Ka | G09G 3/3406 |
| 2018/0005585 A1* | 1/2018 | Kim | H10K 59/352 |
| 2018/0090061 A1* | 3/2018 | Kim | G09G 3/3233 |
| 2018/0151660 A1* | 5/2018 | Kim | H10K 59/1213 |
| 2018/0151663 A1* | 5/2018 | Kim | H10K 59/1315 |

FOREIGN PATENT DOCUMENTS

| | | |
|---|---|---|
| JP | 2010-224426 A | 10/2010 |
| JP | 2012-028761 A | 2/2012 |
| JP | 2012-253036 A | 12/2012 |
| JP | 2014-145849 A | 8/2014 |
| WO | 2014/126662 A1 | 8/2014 |

* cited by examiner

*Primary Examiner* — Vongsavanh Sengdara
(74) *Attorney, Agent, or Firm* — ScienBiziP, P.C.

(57) ABSTRACT

A display device includes a metal pattern formed, in a frame region between a variant edge portion of the display device forming a cutout portion, and a display region. The metal pattern is formed from a metal layer conforming to at least a portion of the shape of the cutout portion.

16 Claims, 7 Drawing Sheets

DISPLAY DEVICE AND METHOD FOR MANUFACTURING DISPLAY DEVICE

TECHNICAL FIELD

The present invention is related to a display device and a manufacturing method of a display device.

BACKGROUND ART

PTL 1 describes a display device including a cutout portion (also called a notch portion) for mounting a camera or the like.

CITATION LIST

Patent Literature

PTL 1: International Application Publication No. WO 2014/126662 A1 (published Aug. 21, 2014)

SUMMARY OF INVENTION

Technical Problem

However, a display device including a cutout portion for mounting a camera or the like such as that described in PTL 1 has the following problems.

FIG. 7 is a diagram for describing a manufacturing process and problems of a conventional display device 105 including a cutout portion K1.

As illustrated in (a) of FIG. 7, the singulated display device 101 includes a display panel 102, a first film 103 provided on a surface on one side of the display panel 102, and a second film 104 provided on a surface on the other side of the display panel 102. Note that, in the first film 103, a portion covering terminal portions TM1 to TMm provided in the display panel 102 is peeled off so that electrical inspection of the display panel 102 can be performed using the terminal portions TM1 to TMm.

Then, as illustrated in (a) of FIG. 7, the external shape of the singulated display device 101 is full-cut with, for example, laser light. The term "full-cut" means that the display panel 102, the first film 103, and the second film 104 are collectively cut along a line FC illustrated in (a) of FIG. 7 with laser light. In the singulated display device 101, the inner side of the line FC along which the laser light passes is a main region including a display region DA, and the outer side of the line FC along which the laser light passes is a non-main region not including the display region DA.

The display device 105 including the cutout portion K1 illustrated in (b) of FIG. 7 can be obtained by removing the full-cut external shape portion (non-main region) from the singulated display device 101 and peeling off the first film 103. That is, the display device 105 includes a display panel in which the external shape portion and the cutout portion K1 are removed and a second film in which the external shape portion and the cutout portion K1 are removed. Note that the variant edge portion BL1 of the display device 105, which is a cutting line for forming the cutout portion K1 only refers to a portion of the line FC, along which the laser light passes, associated with the formation of the cutout portion K1. A frame region NA of the display device 105 is provided with lead wiring lines TW1 to TWn that are electrically connected to the terminal portions TM1 to TMm.

In section A as illustrated in (a) of FIG. 7, when forming the cutout portion K1, the laser light tends to be concentrated at the corner of a section, recessed with a small radius of curvature, cut using the laser light. This causes small cracks (or flaws) to be formed. In addition, when the singulated display device 101 is bent, small cracks (or flaws) are formed because stress tends to concentrate at the corners. As illustrated in (b) of FIG. 7 and (c) of FIG. 7, which is an enlarged view of section B in (b) of FIG. 7, at the section where small cracks (or flaws) are formed, film stress is released in the direction in which the curvature increases. Thus, when there is a small crack (or flaw) in an inorganic film provided in the frame region NA around the cutout portion K1, this small crack (or flaw) expands in the film stress release direction in the drawing, becoming a large crack (or flaw) Cra. This causes a problem in the reliability of the display device 105. Here, the term "film stress" refers to a result of a polyimide film and the like in the display panel 102, the second film 104, and the like provided on the display device 105 expanding and contracting due to changes in the ambient humidity and temperature.

An aspect of the present invention has been made in view of the above-described issue, and has an object to provide a display device and a manufacturing method of a display device with enhanced reliability.

Solution to Problem

To solve the problems described above, a display device according to an aspect of the present invention includes:
a display region;
a frame region surrounding the display region; and
a cutout portion provided in the frame region,
wherein a resin layer, a plurality of inorganic insulating films formed above the resin layer, and a metal layer formed above and in contact with one inorganic insulating film from among the plurality of inorganic insulating films are provided;
wherein a metal pattern formed from the metal layer is formed, conforming to at least a portion of a shape of the cutout portion, in the frame region between a variant edge portion of the display device forming the cutout portion and the display region; and
wherein the metal pattern is not electrically connected to a wiring line of the display region.

To solve the problems described above, a manufacturing method of a display device according to an aspect of the present invention is a manufacturing method of a display device provided with a display region, a frame region surrounding the display region, and a cutout portion provided in the frame region, including:
forming a resin layer;
forming a plurality of inorganic insulating films above the resin layer;
forming a metal layer above and in contact with one inorganic insulating film from among the plurality of inorganic insulating films; and
forming a metal pattern by patterning the metal layer to conforming to at least a portion of a shape of the cutout portion, in the frame region between a variant edge portion of the display device forming the cutout portion and the display region.

Advantageous Effects of Invention

According to an aspect of the present invention, a display device with enhanced reliability that includes a cutout portion and a manufacturing method of a display device can be provided.

DESCRIPTION OF EMBODIMENTS

Figure 1:
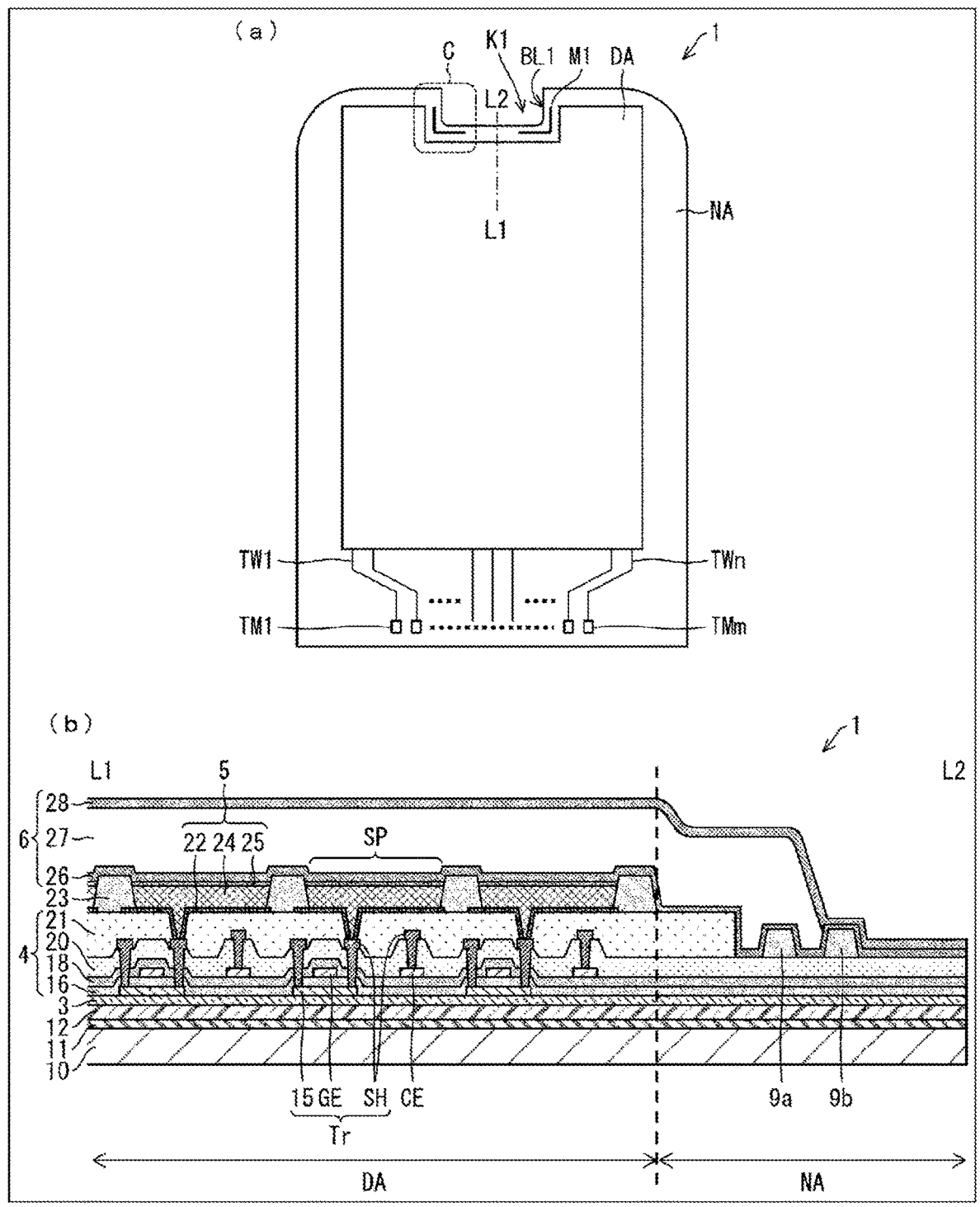
FIG. 1(a) is a plan view of a display device of the first embodiment.
FIG. 1(b) is a cross-sectional view taken along line L1-L2 illustrated in FIG. 1(a).

Embodiments of the present invention are described below with reference to FIG. 1 to FIG. 7. Hereinafter, for convenience of description, components having the same functions as those described in a specific embodiment are denoted by the same reference numerals, and descriptions thereof may be omitted.

Note that in the embodiments described below, a display device provided with an organic light emitting diode (OLED) is used as an example of a display device. However, the embodiment of the present invention is not limited thereto. The display device may be provided with an inorganic light emitting diode or a quantum dot light emitting diode (QLED). The display device is only required to include a cutout portion (notch portion) and is not particularly limited to any type.

First Embodiment

Hereinafter, display devices 1, 1a, 1b, 1c, 1d, 1e of a first embodiment of the present invention will be described with reference to FIGS. 1 to 4.

(a) of FIG. 1 is a plan view of the display device 1, and (b) of FIG. 1 is a cross-sectional view taken along line L1-L2 illustrated in (a) of FIG. 1.

The display device 1 illustrated in (a) of FIG. 1 is obtained by the external shape of a singulated display device being full-cut with, for example, laser light. The display device 1 includes a display region DA and a frame region NA surrounding the display region DA. A variant edge portion BL1 of the display device 1, which is a cutting line for forming a cutout portion K1 only refers to a portion of a line, along which the laser light passes, associated with the formation of the cutout portion K1. Also, the frame region NA of the display device 1 is provided with lead wiring lines TW1 to TWn that are electrically connected to terminal portions TM1 to TMm.

A metal pattern M1 is formed, in the frame region NA of the display device 1, between the variant edge portion BL1 of the display device 1, which is a cutting line for forming the cutout portion K1, and the display region DA, with the metal pattern M1 being formed conforming to at least a portion of the shape of the cutout portion K1. Note that the metal pattern M1 is not electrically connected to wiring line and the like from the display region DA to be described later. In other words, the metal pattern M1 is in an electrically unconnected state with wiring line and the like from the display region DA to be described later.

Note that the metal pattern M1 and wiring line and the like from the display region DA are electrically disconnected to nullify the effects of the metal pattern M1 on the wiring line of the display region DA and the like.

In the display region DA of the display device 1 illustrated in (b) of FIG. 1, a base substrate 10 is attached to the lower face of a resin layer 12 via an adhesive layer 11. On the upper face of the resin layer 12, a barrier layer (base coat film) 3 that is an inorganic film, a TFT layer 4, an organic EL element layer 5, and a sealing layer 6 are formed.

An example of the material of the base substrate 10 includes polyethylene terephthalate (PET), but the material is not limited thereto.

Examples of the adhesive layer 11 include, but are not limited to, an optical clear adhesive (OCA) or an optical clear resin (OCR).

Examples of the material of the resin layer 12 include a polyimide resin, an epoxy resin, and a polyamide resin, but are not limited thereto.

The barrier layer 3 is a layer configured to prevent moisture or impurities from reaching the TFT layer 4 or the organic EL element layer 5 and can be constituted by, for example, a silicon oxide film, a silicon nitride film or a silicon oxynitride film, or a layered film of these films that are formed using CVD.

The TFT layer 4 is provided on an layer above the resin layer 12 and the barrier layer 3. The TFT layer 4 includes a semiconductor film 15, an inorganic insulating film (a gate insulating film) 16 as an upper layer of the semiconductor film 15, a gate electrode GE as an upper layer of the inorganic insulating film 16, an inorganic insulating film (a first insulating film) 18 as an upper layer of the gate electrode GE, capacitance wiring line CE as an upper layer of the inorganic insulating film 18, an inorganic insulating film (a second insulating film) 20 as an upper layer of the capacitance wiring line CE, a source and drain wiring line (the source wiring line including a source electrode and the drain wiring line including a drain electrode) SH including a source-drain electrode as an upper layer of the inorganic insulating film 20, and an interlayer insulating film 21 as an upper layer of the source and drain wiring line SH.

Note that a capacitance element includes a capacitance electrode included in the capacitance wiring line CE formed directly above the inorganic insulating film 18, the inorganic insulating film 18, and a capacitance counter electrode formed directly below the inorganic insulating film 18 and formed overlapping the capacitance electrode in the same layer as the layer that forms the gate electrode GE.

A thin film transistor element (TFT) Tr includes, as active elements, the semiconductor film 15, the inorganic insulating film 16, the gate electrode GE, the inorganic insulating film 18, the inorganic insulating film 20, and the source and drain wiring line SH.

The semiconductor film 15 is formed of low-temperature polysilicon (LTPS) or an oxide semiconductor, for example.

The gate electrode GE, the capacitance wiring line CE, and the source and drain wiring line SH are each formed of a single layer film or a layered film of metal, the metal including at least one of aluminum (Al), tungsten (W), molybdenum (Mo), tantalum (Ta), chromium (Cr), titanium (Ti), copper (Cu), and silver (Ag) for example.

The inorganic insulating films 16, 18, 20 may be formed, for example, by CVD, of a silicon oxide (SiOx) film, a silicon nitride (SiNx) film, or a silicon oxynitride film, or by a layered film of these.

The interlayer insulating film 21 may be formed, for example, of a coatable photosensitive organic material, such as a polyimide resin and an acrylic resin.

The organic EL element layer 5 is provided with an anode 22 in an upper layer overlying the interlayer insulating film 21, a bank 23 that covers an edge of the anode 22, an electroluminescence (EL) layer 24 in an upper layer overlying the anode 22, and a cathode 25 in an upper layer overlying the EL layer 24. A light-emitting element and includes the anode 22 having an island shape, the EL layer 24, and the cathode 25 on a per subpixel SP basis. The bank (anode edge cover) 23 can be formed of a coatable photosensitive organic material, such as a polyimide resin or an acrylic resin, for example. The organic EL element layer 5 forms the display region DA and is provided on a layer above the TFT layer 4.

For example, the EL layers 24 are formed by layering a hole injection layer, a hole transport layer, a light-emitting layer, an electron transport layer, and an electron injection layer in this order, from the lower layer side. The light-emitting layer is formed in an island shape for each subpixel by a vapor deposition method or ink-jet method, but the other layers may be a solid-like common layer. A configuration is also possible in which one or more layers are not formed, out of the hole injection layer, the hole transport layer, the electron transport layer, and the electron injection layer.

The anode (anode electrode) 22 is photoreflective and is formed by layering Indium Tin Oxide (ITO) and an alloy containing Ag, for example. The cathode 25 may be formed of a transparent conductive material such as Indium Tin Oxide (ITO) or Indium Zinc Oxide (IZO).

Holes and electrons are recombined in the EL layer 24 by a driving current between the anode 22 and the cathode 25 in the organic EL element layer 5, and the excitons generated thereby fall to the ground state such that light is emitted. Since the cathode 25 is transparent and the anode 22 has light reflectivity, the light emitted from the EL layer 24 travels upward and becomes top-emitting.

The sealing layer 6 is transparent, and includes a first inorganic sealing film 26 that covers the cathode 25, an organic sealing film 27 that is formed on the first inorganic sealing film 26, and a second inorganic sealing film 28 that covers the organic sealing film 27. The sealing layer 6 covering the organic EL element layer 5 inhibits foreign matter, such as water and oxygen, from penetrating to the organic EL element layer 5.

Each of the first inorganic sealing film 26 and the second inorganic sealing film 28 may be formed of, for example, a silicon oxide film, a silicon nitride film, or a silicon oxynitride film, or of a layered film of these, formed through CVD. The organic sealing film 27 is thicker than the first inorganic sealing film 26 and the second inorganic sealing film 28, is a transparent organic film, and can be formed of a coatable photosensitive organic material such as a polyimide resin or an acrylic resin.

In the frame region NA of the display device 1 illustrated in (b) of FIG. 1, a first frame-shaped bank (first projection) 9a surrounding the display region DA in a frame shape and a second frame-shaped bank (second projection) 9b surrounding the first frame-shaped bank 9a in a frame shape are provided on the inorganic insulating film 20.

In the process of forming the organic sealing film 27 in the sealing layer 6, the first frame-shaped bank 9a and the second frame-shaped bank 9b regulate the wet spreading of the liquid organic material when the liquid organic material is used to coat at least to the entire surface of the display region DA.

In the case of the display device 1 illustrated in (b) of FIG. 1, the organic sealing film 27 is formed to the inclined side surface on the left side of the second frame-shaped bank 9b. Thus, the first inorganic sealing film 26 and the second inorganic sealing film 28, which are inorganic films, are in direct contact with each other on the outer side of the inclined side surface on the left side of the second frame-shaped bank 9b and form a sealing layer.

The first frame-shaped bank 9a and the second frame-shaped bank 9b may be formed of a coatable photosensitive organic material, such as polyimide, acrylic resin, or the like. Also, the first frame-shaped bank 9a and the second frame-shaped bank 9b may be formed using the same material as the bank (anode edge cover) 23.

Figure 2:
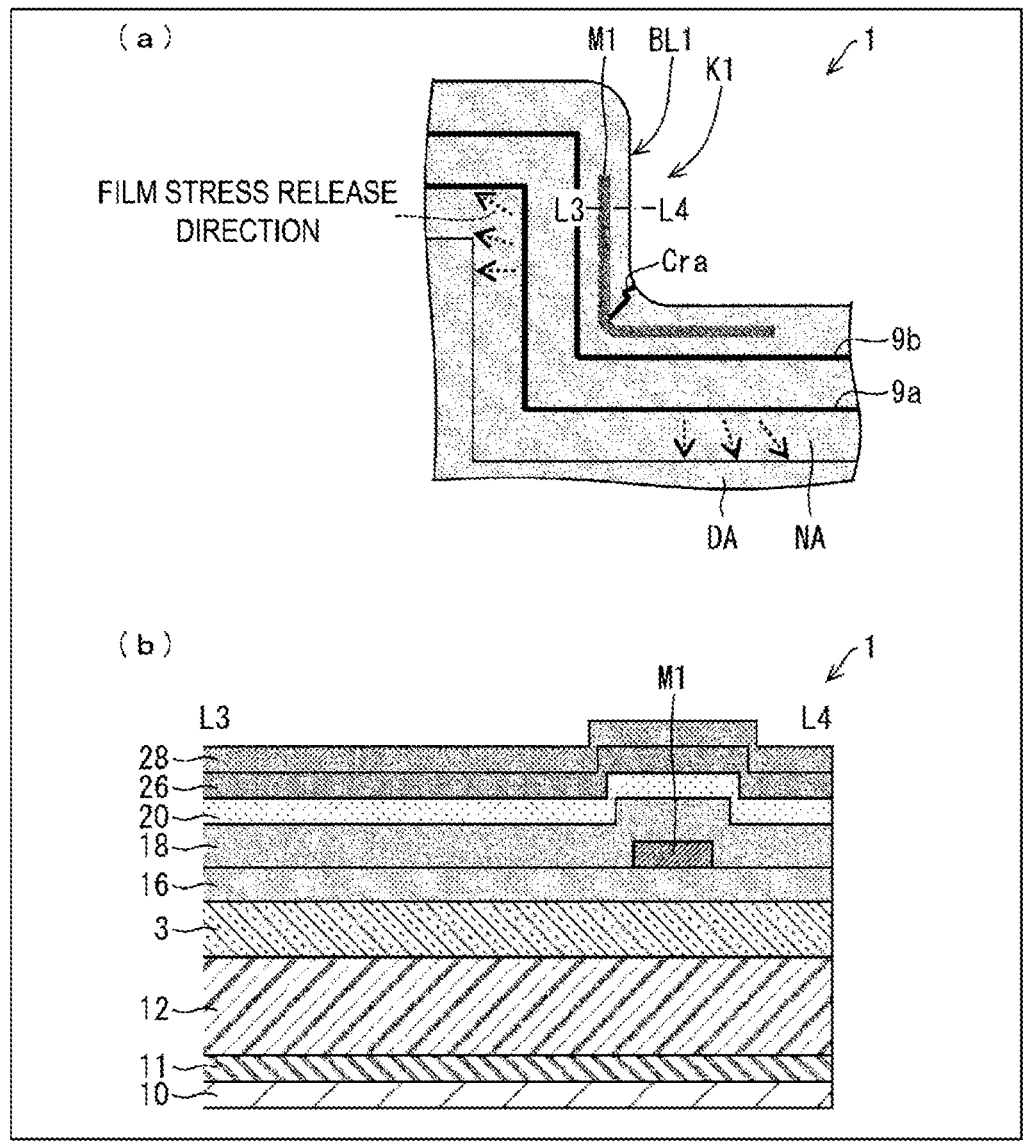
FIG. 2(a) is an enlarged view of section C illustrated in (a) of FIG. 1.
FIG. 2(b) is a cross-sectional view taken along line L3-L4 illustrated in FIG. 2(a).

(a) of FIG. 2 is an enlarged view of section C illustrated in (a) of FIG. 1, and (b) of FIG. 2 is a cross-sectional view taken along line L3-L4 illustrated in (a) of FIG. 2.

As illustrated in (a) of FIG. 2, the variant edge portion BL1 of the display device 1, which is a cutting line for forming the cutout portion K1, is formed as a recess with a small radius of curvature, and thus includes a curved portion.

In the present embodiment, the metal pattern M1 is formed into a shape including a portion that conforms to the shape of the curved portion of the variant edge portion BL1 of the display device 1. However, the shape of the metal pattern M1 is not particularly limited to this shape, and the metal pattern M1 is only required to be formed between the display region DA and the variant edge portion BL1 of the display device 1.

In addition, as illustrated in (a) of FIG. 2, in the present embodiment, the metal pattern M1 is formed between the second frame-shaped bank 9b and the variant edge portion BL1 of the display device 1 in order to suppress the expansion of a crack (or flaw) Cra to the outside of the frame region NA, as the expansion of the crack (or flaw) Cra can allow moisture to enter. In other words, the metal pattern M1 is formed on the outer side of the first frame-shaped bank 9a and the second frame-shaped bank 9b. However, the no such limitation is intended, and the metal pattern M1 may be formed between the display region DA and the variant edge portion BL1 of the display device 1.

In addition, as illustrated in (b) of FIG. 2, in the present embodiment, the metal pattern M1 is formed directly above the inorganic insulating film (gate insulating film) 16 in the same layer as the layer forming the gate electrode GE provided in the display region DA. In other words, the metal pattern M1 is sandwiched between the inorganic insulating film 16 and the inorganic insulating film (the first insulating film) 18.

As illustrated in (a) of FIG. 2, in the display device 1, the crack (or flaw) Cra is present that is formed when the external shape of a singulated display device is full-cut with, for example, laser light. However, because the metal pattern M1 provided on the display device 1 is disposed in at or near the curved portion of the variant edge portion BL1 of the display device 1, even if film stress occurs due to the expansion and contraction of the resin layer 12 due to changes in the ambient humidity and temperature, the crack (or flaw) Cra can be suppressed from expanding in the film stress release direction in the drawing.

Note that small cracks (or flaws) tend to occur when the inorganic film is cut, and the small cracks (or scratches) that occur have a greater tendency to expand the greater the film thickness of the inorganic film is. A similar tendency can also be seen in the case of an inorganic layered film including a plurality of layered inorganic films, and not just in the case of a single-layer inorganic film. In the case in which the film thickness of the single-layer inorganic film or the thickness of the inorganic layered film including the plurality of layered inorganic films is a thickness of approximately 500 nm or greater, the tendency for small cracks (or flaws) to significantly expand in the film stress release direction can be seen. On the other hand, in the case in which the film thickness of the single-layer inorganic film or the thickness of the inorganic layered film including the plurality of layered inorganic films is a thickness of approximately 200 nm or less, that the small cracks (or flaws) do not expand in the film stress release direction can be seen.

Therefore, in the present embodiment, as illustrated in (b) of FIG. 2, the metal pattern M1 is formed above the inorganic layered film including the barrier layer 3 and the inorganic insulating film 16, that is, directly above the inorganic insulating film 16. In this way, in the inorganic layered film including the barrier layer 3, the inorganic insulating film 16, the inorganic insulating film 18, the inorganic insulating film 20, the first inorganic sealing film 26, and the second inorganic sealing film 28, a portion where the inorganic layered film including the barrier layer 3 and the inorganic insulating film 16 and the inorganic layered film including the inorganic insulating film 18, the inorganic insulating film 20, the first inorganic sealing film 26, and the second inorganic sealing film 28 are separated can be formed. From the above, on the basis of the thickness of the inorganic layered film being thick, significant expansion of small cracks (or flaws) in the film stress release direction can be suppressed.

Note that in the frame region NA at or near the curved portion of the variant edge portion BL1 of the display device 1, which is a section where the crack (or flaw) Cra occurs, deformation, such as thermal expansion and moisture expansion, of the resin layer due to changes in the ambient humidity and temperature may accelerate the expansion of the crack (or flaw) Cra. To efficiently suppress this, in the present embodiment, the metal pattern M1 is formed as illustrated in (a) of FIG. 2. Specifically, the metal pattern M1 is formed in a substantially L-shaped shape conforming to the shape of the curved portion of the variant edge portion BL1 of the display device 1 at or near the curved portion of the variant edge portion BL1 of the display device 1. The shape of the metal pattern M1 is not limited to this.

As described above, the display device 1 includes the metal pattern M1 in the frame region NA at or near the curved portion of the variant edge portion BL1 of the display device 1. Thus, at this portion, deformation, such as thermal expansion and moisture expansion, of the resin layer due to changes in the ambient humidity and temperature can be suppressed, and the significant expansion of small cracks (or flaws) in the film stress release direction can be suppressed.

The display device 1, as described above, can be obtained by the external shape of the singulated display device being full-cut, for example, with laser light. However, at this time, in the frame region NA at or near the variant edge portion BL1 of the display device 1, and particularly, the frame region NA at or near the curved portion of the variant edge portion BL1 of the display device 1, the crack (or flaw) Cra is prone to forming.

As described above, because the display device 1 is provided with the metal pattern M1, even if there is the crack (or flaw) Cra, the crack (or flaw) Cra can be prevented from expanding, and thus a problem in the reliability can be prevented.

Note that in the present embodiment, the curvature of the curved portion of the variant edge portion BL1 of the display device 1 is 0.5 mm, the width of the metal pattern M1 is 0.07 mm, and the overall length of the metal pattern M1 is 2 mm. However, these are examples, and the width and the overall length of the metal pattern M1 can be selected as appropriate. Note that the width of the metal pattern M1 is preferably greater than or equal to 30 μm, and the total length is preferably at least twice the curvature.

Note that a method for manufacturing the display device 1 including the display region DA, the frame region NA surrounding the display region DA, and the cutout portion K1 provided in the frame region NA, as illustrated in (a) of FIG. 1 and (b) of FIG. 1, includes the following steps. Specifically, the method includes: forming the resin layer 12; forming the barrier layer 3, the inorganic insulating film 16, the inorganic insulating film 18, the inorganic insulating film 20, the first inorganic sealing film 26, and the second inorganic sealing film 28 above the resin layer 12; forming a metal layer above and in contact with one of the plurality of inorganic insulating films; and forming the metal pattern by patterning the metal layer so that the metal layer conforms with at least one portion of the shape of the cutout portion K1, in the frame region NA between the variant edge portion BL1 of the display device 1, which is a cutting line for forming the cutout portion K1, and the display region DA.

Figure 3:
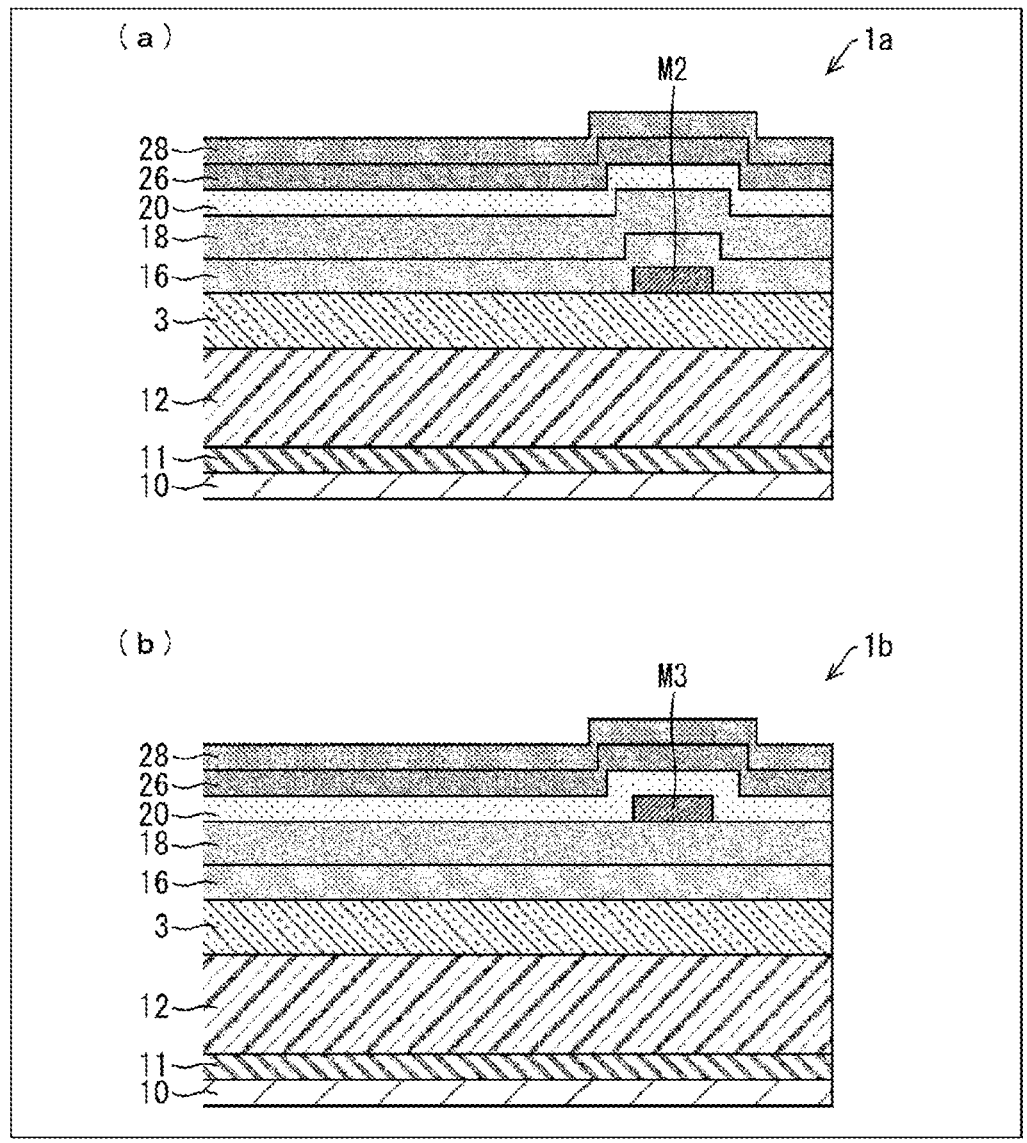
FIG. 3(a) is a cross-sectional view illustrating a schematic configuration of a frame region surrounding a cutout portion of a display device of a first modified example.
FIG. 3(b) is a cross-sectional view illustrating a schematic configuration of a frame region surrounding a cutout portion of a display device of a second modified example.

First Modified Example and Second Modified Example (a) of FIG. 3 is a cross-sectional view illustrating a schematic configuration of a frame region surrounding a cutout portion of a display device 1a of a first modified example. (b) of FIG. 3 is a cross-sectional view illustrating a schematic configuration of a frame region surrounding a cutout portion of a display device 1b of a second modified example.

In the display device 1a illustrated in (a) of FIG. 3, as in the display device 1 illustrated in (a) of FIG. 2, a metal pattern M2 is formed in a substantially L-shaped shape between the second frame-shaped bank 9b and the variant edge portion BL1 of the display device 1a. However, no such limitation is intended, and the metal pattern M2 may be formed in a different shape between the display region DA and the variant edge portion BL1 of the display device 1a.

In addition, as illustrated in (a) of FIG. 3, in the display device 1a, the metal pattern M2 is formed directly above the barrier layer (base coat film) 3 in the same layer as the layer forming the gate electrode provided in the display region. In other words, the metal pattern M2 is sandwiched between the barrier layer 3 and the inorganic insulating film 16.

Note that the thin film transistor element Tr illustrated in (b) of FIG. 1 has a top gate structure, with the gate electrode GE being disposed directly above the inorganic insulating film (gate insulating film) 16. Thus, in the display device 1a, the thin film transistor element with a bottom gate structure is formed in the display region, the gate electrode GE is disposed directly above the barrier layer (base coat film) 3, and the inorganic insulating film (gate insulating film) 16 is disposed directly above the gate electrode GE.

In the display device 1a, as illustrated in (a) of FIG. 3, the metal pattern M2 is formed directly above the barrier layer 3. In this way, in the inorganic layered film including the barrier layer 3, the inorganic insulating film 16, the inorganic insulating film 18, the inorganic insulating film 20, the first inorganic sealing film 26, and the second inorganic sealing film 28, a portion where the barrier layer 3 and the inorganic layered film including the inorganic insulating film 16, the inorganic insulating film 18, the inorganic insulating film 20, the first inorganic sealing film 26, and the second inorganic sealing film 28 are separated can be formed. From the above, on the basis of the thickness of the inorganic film or the inorganic layered film being thick, significant expansion of small cracks (or flaws) in the film stress release direction can be suppressed.

Also, the display device 1a includes the metal pattern M2 in the frame region NA at or near the curved portion of the variant edge portion BL1 of the display device 1a. Thus, at this portion, deformation, such as thermal expansion and moisture expansion, of the resin layer due to changes in the ambient humidity and temperature can be suppressed, and the significant expansion of small cracks (or flaws) in the film stress release direction can be suppressed.

In the display device 1b illustrated in (b) of FIG. 3, as in the display device 1 illustrated in (a) of FIG. 2, a metal pattern M3 is formed in a substantially L-shaped shape between the second frame-shaped bank 9b and the variant edge portion BL1 of the display device 1b. However, no such limitation is intended, and the metal pattern M3 may be formed in a different shape between the display region DA and the variant edge portion BL1 of the display device 1b.

In addition, as illustrated in (b) of FIG. 3, in the display device 1b, the metal pattern M3 is formed directly above the inorganic insulating film (the first insulating film) 18 in the same layer as the layer forming the capacitance wiring line CE provided in the display region DA illustrated in (b) of FIG. 1. In other words, the metal pattern M3 is sandwiched between the inorganic insulating film (the first insulating film) 18 and the inorganic insulating film (the second insulating film) 20.

In the display device 1b, as illustrated in (b) of FIG. 3, the metal pattern M3 is formed directly above the inorganic insulating film 18. In this way, in the inorganic layered film including the barrier layer 3, the inorganic insulating film 16, the inorganic insulating film 18, the inorganic insulating film 20, the first inorganic sealing film 26, and the second inorganic sealing film 28, a portion where the inorganic layered film including the barrier layer 3, the inorganic insulating film 16, and the inorganic insulating film 18 and the inorganic layered film including the inorganic insulating film 20, the first inorganic sealing film 26, and the second inorganic sealing film 28 are separated can be formed. From the above, on the basis of the thickness of the inorganic layered film being thick, significant expansion of small cracks (or flaws) in the film stress release direction can be suppressed.

Also, the display device 1b includes the metal pattern M3 in the frame region NA at or near the curved portion of the variant edge portion BL1 of the display device 1b. Thus, at this portion, deformation, such as thermal expansion and moisture expansion, of the resin layer due to changes in the ambient humidity and temperature can be suppressed, and the significant expansion of small cracks (or flaws) in the film stress release direction can be suppressed.

Figure 4:
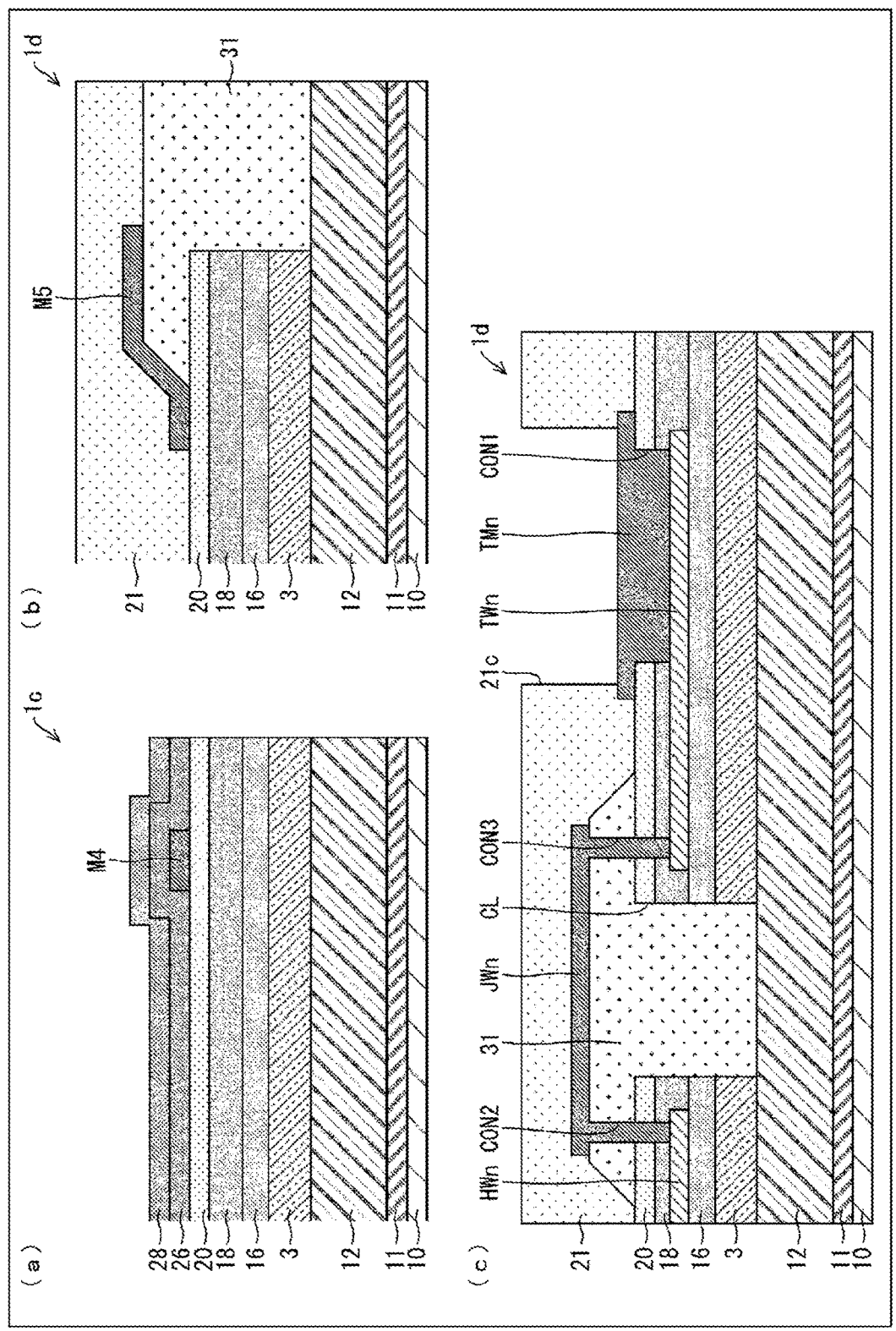
FIG. 4(a) is a cross-sectional view illustrating a schematic configuration of a frame region surrounding a cutout portion of a display device of a third modified example.
FIG. 4(b) is a cross-sectional view illustrating a schematic configuration of a frame region surrounding a cutout portion of a display device of a fourth modified example.
FIG. 4(c) is a cross-sectional view illustrating a schematic configuration of a bend slit and a terminal portion of the display device of the fourth modified example.

Third Modified Example and Fourth Modified Example (a) of FIG. 4 is a cross-sectional view illustrating a schematic configuration of a frame region surrounding a cutout portion of a display device 1c of a third modified example. (b) of FIG. 4 is a cross-sectional view illustrating a schematic configuration of a frame region surrounding a cutout portion of a display device 1d of a fourth modified example. (c) of FIG. 4 is a cross-sectional view illustrating a schematic configuration of a bend slit CL and a terminal portion TMn of the display device 1d of the fourth modified example.

In the display device 1e illustrated in (a) of FIG. 4, as in the display device 1 illustrated in (a) of FIG. 2, a metal pattern M4 is formed in a substantially L-shaped shape between the second frame-shaped bank 9b and the variant edge portion BL1 of the display device 1c. However, no such limitation is intended, and the metal pattern M4 may be formed in a different shape between the display region DA and the variant edge portion BL1 of the display device 1c.

In addition, as illustrated in (a) of FIG. 4, in the display device 1c, the metal pattern M4 is formed directly above the inorganic insulating film (the second insulating film) 20 in the same layer as the layer forming the source and drain wiring line SH provided in the display region DA illustrated in (b) of FIG. 1. In other words, the metal pattern M4 is sandwiched between the inorganic insulating film (the second insulating film) 20 and the first inorganic sealing film 26.

In the display device 1c, as illustrated in (a) of FIG. 4, the metal pattern M4 is formed directly above the inorganic insulating film 20. In this way, in the inorganic layered film including the barrier layer 3, the inorganic insulating film 16, the inorganic insulating film 18, the inorganic insulating film 20, the first inorganic sealing film 26, and the second inorganic sealing film 28, a portion where the inorganic layered film including the barrier layer 3, the inorganic insulating film 16, the inorganic insulating film 18, and the inorganic insulating film 20 and the inorganic layered film including the first inorganic sealing film 26 and the second inorganic sealing film 28 are separated can be formed. From the above, on the basis of the thickness of the inorganic layered film being thick, significant expansion of small cracks (or flaws) in the film stress release direction can be suppressed.

Also, the display device 1c includes the metal pattern M4 in the frame region NA at or near the curved portion of the variant edge portion BL1 of the display device 1c. Thus, at this portion, deformation, such as thermal expansion and moisture expansion, of the resin layer due to changes in the ambient humidity and temperature can be suppressed, and the significant expansion of small cracks (or flaws) in the film stress release direction can be suppressed.

In the display device 1d illustrated in (b) of FIG. 4, as in the display device 1 illustrated in (a) of FIG. 2, a metal pattern M5 is formed in a substantially L-shaped shape between the second frame-shaped bank 9b and the variant edge portion BL1 of the display device 1d. However, no such limitation is intended, and the metal pattern M5 may be formed in a different shape between the display region DA and the variant edge portion BL1 of the display device 1d.

In addition, as illustrated in (b) of FIG. 4, in the display device 1d, the metal pattern M5 is formed in the same layer as the layer forming the source and drain wiring line SH provided in the display region DA illustrated in (b) of FIG. 1.

Note that the display device 1d illustrated in (b) of FIG. 4 has a different configuration from that of the display device 1 illustrated in (b) of FIG. 1 in that the first inorganic sealing film 26 and the second inorganic sealing film 28 are formed to where they overlap the second frame-shaped bank 9b, and the first inorganic sealing film 26 and the second inorganic sealing film 28 are not formed on the outer side of the second frame-shaped bank 9b.

Thus, in the display device 1d illustrated in (b) of FIG. 4, an end portion of the inorganic layered film, which is a layer located below the metal layer forming the metal pattern M5 that includes the barrier layer 3, the inorganic insulating film 16, the inorganic insulating film 18, and the inorganic insulating film 20, is formed to the display region DA side (left side in the drawing) of an end portion of the resin layer 12, and a flattening film 31 is formed covering the end portion of the inorganic layered film. The metal pattern M5 is formed covering the interface between the inorganic insulating film 20 in the inorganic layered film and the flattening film 31. Also, the interlayer insulating film 21 is formed covering the metal pattern M5, the inorganic insulating film 20, and the flattening film 31.

As illustrated in (c) of FIG. 4, in the display device 1d, the bend slit CL for allowing the display device 1d to bend is formed between the display region DA and terminal portions TM1 to TMn on the outer side of the second frame-shaped bank 9b.

The terminal portions TM1 to TMn are electrically connected to the lead wiring lines TW1 to TWn via a plurality of first contact holes CON1.

The bend slit CL is filled with the flattening film 31, which is a resin layer, and a plurality of electrically conductive members JW1 to JWn are formed in island shapes above the bend slit CL filled with the flattening film 31. The electrically conductive members JW1 to JWn are electrically connected to wiring lines HW1 to HWn from the display region DA via a plurality of second contact holes CON2 and are electrically connected to the wiring lines TW1 to TWn via a plurality of third contact holes CON3.

Note that the interlayer insulating film 21 is formed covering the flattening film 31, the electrically conductive members JW1 to JWn, and the inorganic insulating film 20, and a plurality of openings 21c for exposing the terminal portions TM1 to TMn are formed in the interlayer insulating film 21.

Examples of the material of the flattening film 31 include a polyimide resin, an epoxy resin, and a polyamide resin, but are not limited thereto.

Note that in the display device 1d, the flattening film 31 covering the end portion of the inorganic layered film including the barrier layer 3, the inorganic insulating film 16, the inorganic insulating film 18, and the inorganic insulating film 20 and the flattening film 31 filling the bend slit CL are formed in the same single process.

The display device 1d includes the metal pattern M5 in the frame region NA at or near the curved portion of the variant edge portion BL1 of the display device 1d. Thus, at this portion, deformation, such as thermal expansion and moisture expansion, of the resin layer due to changes in the ambient humidity and temperature can be suppressed, and the significant expansion of small cracks (or flaws) in the film stress release direction can be suppressed.

Note that the present embodiment includes examples in which the metal patterns M1 to M5 are formed as a single layer. However, no such limitation is intended, and, for example, the metal pattern M1 illustrated in (b) of FIG. 2 and the metal pattern M4 illustrated in (a) of FIG. 4 may be combined and formed in the frame region NA at or near the variant edge portion BL1 of the display device. Also, for example, the metal pattern M1 illustrated in (b) of FIG. 2, the metal pattern M3 illustrated in (b) of FIG. 3, and the metal pattern M4 illustrated in (a) of FIG. 4 may be combined and formed in the frame region NA at or near the variant edge portion BL1 of the display device. In even more examples, the metal pattern may be formed in the frame region NA at or near the curved portion of the variant edge portion BL1 of the display device, the metal pattern M1 and the metal pattern M4 may be formed overlapping one another, and the metal pattern M1, the metal pattern M3, and the metal pattern M4 may be formed overlapping one another.

Second Embodiment

Next, with reference to FIG. 5, a second embodiment of the present invention will be described. A display device 50 of the present embodiment is the same as the display device of the first embodiment except that a metal pattern M6 includes an end portion ED1 and an end portion ED2 at positions in directions orthogonal to the linear portions of the adjacent cutout portion K1 and the width of the metal pattern M6 decreases toward the end portion ED1 and the end portion ED2. For convenience of description, members having the same functions as those of the members illustrated in the drawings in the first embodiment are denoted by the same reference numerals, and descriptions thereof will be omitted.

Figure 5:
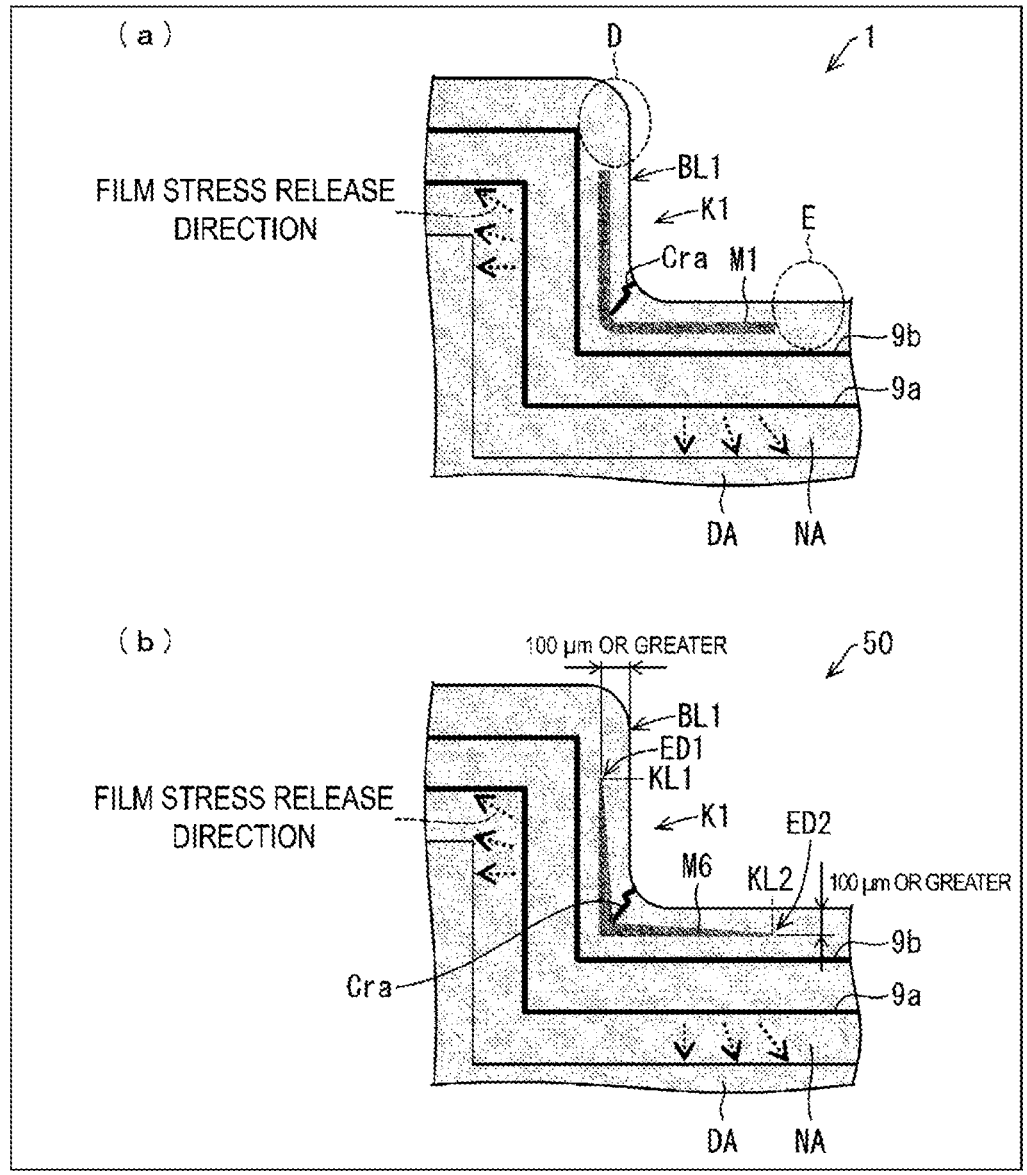
FIG. 5(a) is a plan view illustrating a frame region surrounding a cutout portion of the display device of the first embodiment.
FIG. 5(b) is a plan view illustrating a frame region surrounding a cutout portion of a display device of a second embodiment.

(a) of FIG. 5 is a plan view illustrating the frame region NA surrounding the cutout portion K1 of the display device 1 of the first embodiment. (b) of FIG. 5 is a plan view illustrating the frame region NA surrounding the cutout portion K1 of the display device 50 of the second embodiment.

As illustrated in (a) of FIG. 5, in the case in which both end portions of the metal pattern M1 are close to the variant edge portion BL1 of the display device 1, a crack may form in the inorganic film due to a difference in the rate of thermal expansion in the portions with no metal pattern M1 at or near both ends (section D and section E in the drawing) of the metal pattern M1.

For this reason, the metal pattern M1 is preferably separated from the variant edge portion BL1 of the display device 1 by approximately 100 μm. However, a display device in which the metal pattern M1 is disposed at a position separated from the variant edge portion BL1 of the display device 1 is difficult to manufacture due to the resulting small frame width.

Thus, the display device 50 illustrated in (b) of FIG. 5 includes the metal pattern M6 to decrease the effects at or near the end portions ED1, ED2 of the metal pattern M6, the metal pattern M6 including the end portion ED1 and the end portion ED2 at positions in directions orthogonal to the linear portions of the adjacent cutout portion K1 and the width of the metal pattern M6 decreasing toward the end portion ED1 and the end portion ED2. In other words, the width of the metal pattern M6 becomes decreases as the metal pattern M6 approaches the end portion ED1 and the end portion ED2 that define the entire length of the metal pattern M6. Note that the total length of the metal pattern M6 is the distance between the end portion ED1 and the end portion ED2 along the metal pattern M6.

As illustrated in (b) of FIG. 5, straight lines KL1 and KL2 orthogonal to the linear portions of the adjacent variant edge portion BL1 of the display device 50 can be drawn from the end portions ED1 and ED2 of the metal pattern M6 to the linear portions of the adjacent variant edge portion BL1 of the display device 50. In the present embodiment, the metal pattern M6 is formed in a shape such that the distance along the straight line KL1 between the end portion ED1 of the metal pattern M6 and the adjacent variant edge portion BL1 of the display device 50 is 100 μm or greater, and the distance along the straight line KL2 between the end portion ED2 of the metal pattern M6 and the adjacent variant edge portion BL1 of the display device 50 is 100 μm or greater.

However, no such limitation is intended. The metal pattern M6 may decrease in width toward either the end portion ED1 or the end portion ED2.

By forming the metal pattern M6 as described above, cracks forming in the inorganic film at or near the end portions ED1 and ED2 of the metal pattern M6 can be suppressed and frame narrowing of the display device 50 can be achieved.

In addition, the metal pattern M6 may be formed between any layer, as long as the metal pattern M6 is formed between the barrier layer 3 and the inorganic insulating film 16, the inorganic insulating film 16 and the inorganic insulating film 18, the inorganic insulating film 18 and the inorganic insulating film 20, or the inorganic insulating film 20 and the first inorganic sealing film 26.

Note that in the present embodiment, the metal pattern M6 is formed in a substantially L-shaped shape conforming to the shape of the curved portion of the variant edge portion BL1 of the display device 50. However, no such limitation is intended, and the metal pattern M6 may be formed in a different shape.

Third Embodiment

Next, a third embodiment of the present invention will be described below with reference to FIG. 6. In frame region surrounding a cutout portion of a display device 60 of the present embodiment, an end portion of the inorganic layered film, which is a layer located below the metal layer forming a metal pattern M7 that includes the barrier layer 3, the inorganic insulating film 16, the inorganic insulating film 18, and the inorganic insulating film 20, is formed to the display region DA side (left side in the drawing) of the end portion of the resin layer 12. Furthermore, the present embodiment is the same as the first embodiment and the second embodiment, except that the metal pattern M7 is formed covering the end portion of the inorganic layered film. For the sake of the description, members having the same functions as the members illustrated in the diagrams in the first and second embodiments are denoted by the same reference numerals, and descriptions thereof will be omitted.

Figure 6:
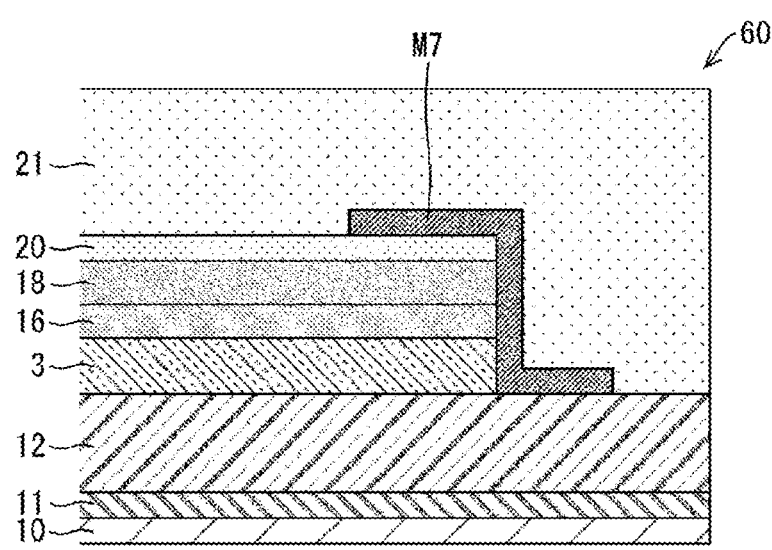
FIG. 6 is a cross-sectional view illustrating a schematic configuration of a frame region surrounding a cutout portion of a display device of a third embodiment.
Figure 7:
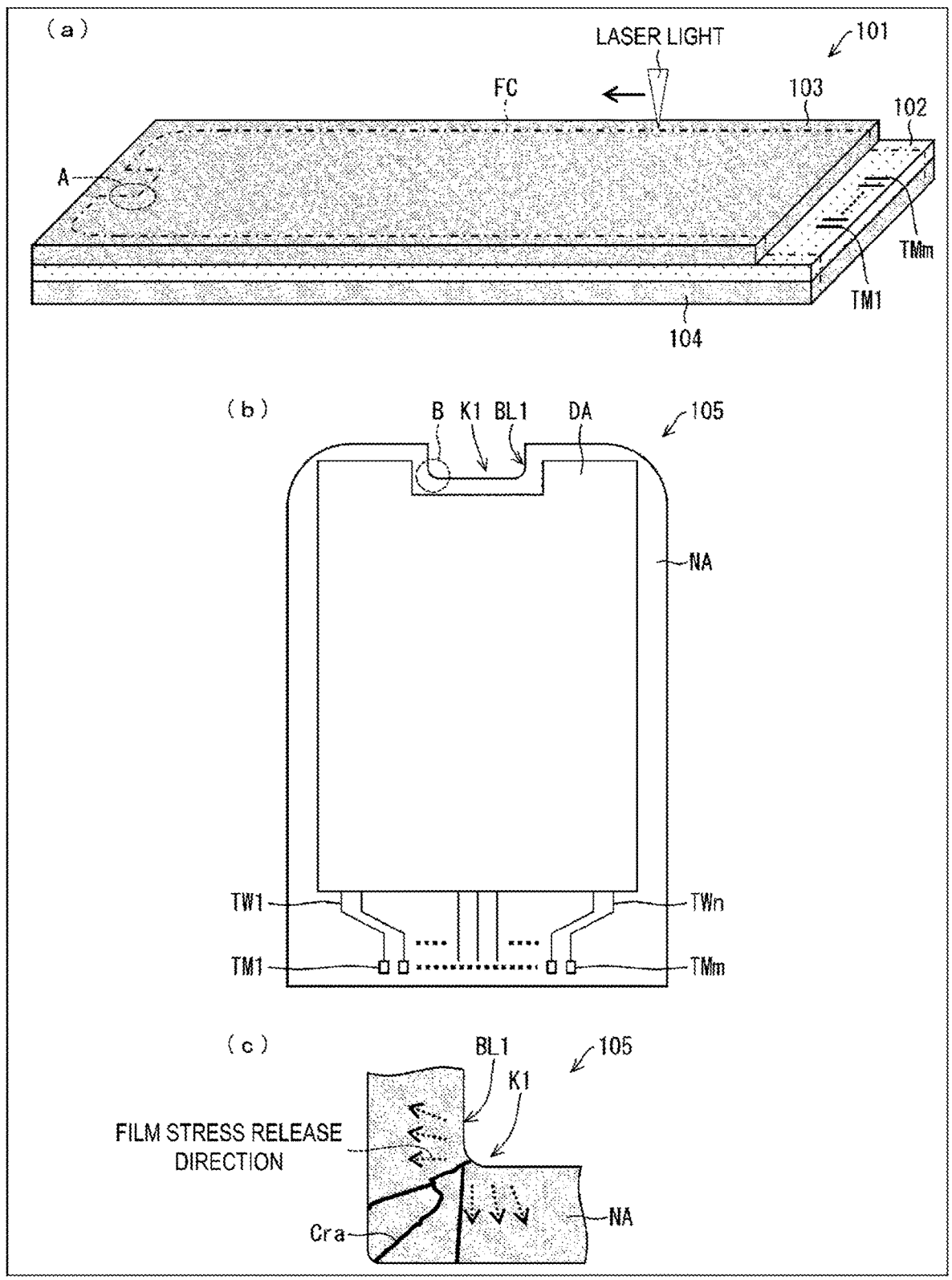
FIG. 7 is a diagram for describing a manufacturing process and problems of a known display device including a cutout portion.

FIG. 6 is a cross-sectional view illustrating a schematic configuration of the frame region surrounding the cutout portion of the display device 60.

In the display device 60 illustrated in FIG. 6, as in the display device 1 illustrated in (a) of FIG. 2, the metal pattern M7 is formed in a substantially L-shaped shape between the second frame-shaped bank 9b and the variant edge portion BL1 of the display device 60. However, no such limitation is intended, and the metal pattern M7 may be formed in a different shape between the display region DA and the variant edge portion BL1 of the display device 60.

In the display device 60, the metal pattern M7 is formed in the same layer as the layer forming the source and drain wiring line SH provided in the display region DA illustrated in (b) of FIG. 1.

Note that the display device 60 illustrated in FIG. 6 has a different configuration from that of the display device 1 illustrated in (b) of FIG. 1 in that the first inorganic sealing film 26 and the second inorganic sealing film 28 are formed to where they overlap the second frame-shaped bank 9b, and the first inorganic sealing film 26 and the second inorganic sealing film 28 are not formed on the outer side of the second frame-shaped bank 9b.

Thus, in the display device 60 illustrated in FIG. 6, an end portion of the inorganic layered film, which is a layer located below the metal layer forming the metal pattern M7 that includes the barrier layer 3, the inorganic insulating film 16, the inorganic insulating film 18, and the inorganic insulating film 20, is formed to the display region DA side (left side in the drawing) of an end portion of the resin layer 12, and the metal pattern M7 is formed covering the end portion of the inorganic layered film. Also, the interlayer insulating film 21 is formed covering the inorganic insulating film 20 and the metal pattern M7.

The display device 60 includes the metal pattern M7 in the frame region NA at or near the curved portion of the variant edge portion BL1 of the display device 60. Thus, at this portion, deformation, such as thermal expansion and moisture expansion, of the resin layer due to changes in the ambient humidity and temperature can be suppressed, and the significant expansion of small cracks (or flaws) in the film stress release direction can be suppressed.

Supplement

First Aspect

A display device includes:
a display region;
a frame region surrounding the display region; and
a cutout portion provided in the frame region,
wherein a resin layer, a plurality of inorganic insulating films formed above the resin layer, and a metal layer formed above and in contact with one inorganic insulating film from among the plurality of inorganic insulating films are provided;
wherein a metal pattern formed from the metal layer is formed, conforming to at least a portion of a shape of the cutout portion, in the frame region between a variant edge portion of the display device forming the cutout portion and the display region; and
wherein the metal pattern is not electrically connected to a wiring line of the display region.

Second Aspect

In the display device according to the first aspect,
the variant edge portion is provided with a curved portion, and
the metal pattern is provided with a portion conforming to a shape of the curved portion of the variant edge portion.

Third Aspect

In the display device according to the first or second aspect,
the metal pattern includes an end portion at a position in a direction orthogonal to a linear portion of the cutout portion adjacent to the metal pattern; and
a width of the metal pattern decreases toward the end portion.

Fourth Aspect

In the display device according to any one of the first to third aspects, the plurality of inorganic insulating films includes a base coat film, a gate insulating film, a first insulating film, and a second insulating film layered in this order above the resin layer;

the display region is provided with a transistor element including a gate electrode formed in contact with the gate insulating film, and a source electrode and a drain electrode included in a source and drain wiring line formed above the second insulating film, and a capacitance element including a capacitance electrode included in a capacitance wiring line formed above the first insulating film, the first insulating film, and a capacitance counter electrode formed overlapping the capacitance electrode below the first insulating film; and the metal pattern is formed in the frame region surrounding the cutout portion from at least one layer from among a first metal layer which is the same layer as a layer forming the gate electrode, a second metal layer which is the same layer as a layer forming the capacitance wiring line, and a third metal layer which is the same layer as a layer forming the source and drain wiring line.

Fifth Aspect

In the display device according to the fourth aspect, the gate electrode is formed directly above the base coat film; and the metal pattern is formed from the first metal layer above the base coat film.

Sixth Aspect

In the display device according to the fourth aspect, the gate electrode is formed above the gate insulating film; and the metal pattern is formed from the first metal layer above the gate insulating film.

Seventh Aspect

In the display device according to the fourth aspect, the metal pattern is formed from the second metal layer above the first insulating film.

Eighth Aspect

In the display device according to the fourth aspect, the metal pattern is formed from the third metal layer above the second insulating film.

Ninth Aspect

In the display device according to the eighth aspect, in the frame region surrounding the cutout portion, an end portion of at least the second insulating film, from among the plurality of inorganic insulating films located lower than the third metal layer, is formed on the display region side of the variant edge portion;

a flattening film is formed covering the end portion of the second insulating film and a portion of a top surface of the second insulating film; and the metal pattern is formed on the flattening film and the top surface of the second insulating film spanning between the flattening film and the second insulating film.

Tenth Aspect

In the display device according to the eighth aspect, in the frame region surrounding the cutout portion, an end portion of at least the second insulating film, from among the plurality of inorganic insulating films located lower than the third metal layer, is formed on the display region side of the variant edge portion; and the metal pattern is formed on the resin layer and the top surface of the second insulating film spanning between the resin layer and the second insulating film.

Eleventh Aspect

In the display device according to any one of the first to tenth aspects, in the frame region, a projection is formed surrounding the display region; and the metal pattern is formed between the projection and the variant edge portion.

Twelfth Aspect

In the display device according to the eleventh aspect, the projection includes a first projection surrounding the display region and a second projection surrounding the first projection; and the metal pattern is formed between the second projection and the variant edge portion.

Thirteenth Aspect

In the display device according to any one of the fifth to eighth aspects, the metal pattern is sandwiched by the plurality of inorganic insulating films.

Fourteenth Aspect

In the display device according to any one of the first to thirteenth aspects, the resin layer is a polyimide resin layer.

Fifteenth Aspect

A manufacturing method of a display device provided with a display region, a frame region surrounding the display region, and a cutout portion provided in the frame region, includes:

forming a resin layer;

forming a plurality of inorganic insulating films above the resin layer;

forming a metal layer above and in contact with one inorganic insulating film from among the plurality of inorganic insulating films; and forming a metal pattern by patterning the metal layer to conforming to at least a portion of a shape of the cutout portion, in the frame region between a variant edge portion of the display device forming the cutout portion and the display region.

Additional Items

The present invention is not limited to each of the embodiments described above, and various modifications may be made within the scope of the claims. Embodiments obtained by appropriately combining technical approaches disclosed in each of the different embodiments also fall within the technical scope of the present invention. Moreover, novel technical features can be formed by combining the technical approaches disclosed in the embodiments.

What is claimed is:

1. A display device comprising:

a display region;

a frame region surrounding the display region; and a cutout portion provided in the frame region, wherein a resin layer, a plurality of inorganic insulating films formed on the resin layer, and a metal layer formed on and in contact with one inorganic insulating film from among the plurality of inorganic insulating films are provided, a metal pattern formed from the metal layer is formed, conforming to at least a portion of a shape of the cutout portion in the frame region between a variant edge portion of the display device forming the cutout portion and the display region, the display region being provided with a plurality of subpixels, and the metal pattern is electrically unconnected to any wiring lines.

2. The display device according to claim 1,
wherein the variant edge portion includes a curved portion, and
the metal pattern includes a portion conforming to a shape of the curved portion of the variant edge portion.

3. The display device according to claim 1,
wherein the metal pattern includes an end portion at a position in a direction orthogonal to a linear portion of the cutout portion adjacent to the metal pattern, and
a width of the metal pattern decreases toward the end portion.

4. The display device according to claim 1,
wherein the plurality of inorganic insulating films includes a base coat film, a gate insulating film, a first insulating film, and a second insulating film layered in this order on the resin layer,
the display region is provided with
a transistor element including a gate electrode formed in contact with the gate insulating film, and a source electrode and a drain electrode included in a source and drain wiring line formed on the second insulating film, and
a capacitance element including a capacitance electrode included in a capacitance wiring line formed on the first insulating film, the first insulating film, and a capacitance counter electrode formed overlapping the capacitance electrode under the first insulating film, and
the metal pattern is formed in the frame region surrounding the cutout portion from at least one layer from among
a first metal layer which is the same layer as a layer forming the gate electrode,
a second metal layer which is the same layer as a layer forming the capacitance wiring line, and
a third metal layer which is the same layer as a layer forming the source and drain wiring line.

5. The display device according to claim 4,
wherein the gate electrode is formed directly above the base coat film, and
the metal pattern is formed from the first metal layer above the base coat film.

6. The display device according to claim 5,
wherein the metal pattern is sandwiched by the plurality of inorganic insulating films.

7. The display device according to claim 4,
wherein the gate electrode is formed on the gate insulating film, and
the metal pattern is formed from the first metal layer on the gate insulating film.

8. The display device according to claim 4,
wherein the metal pattern is formed from the second metal layer on the first insulating film.

9. The display device according to claim 4,
wherein the metal pattern is formed from the third metal layer on the second insulating film.

10. The display device according to claim 9,
wherein in the frame region surrounding the cutout portion, an end portion of at least the second insulating film, from among the plurality of inorganic insulating films located lower than the third metal layer, is formed on the display region side of the variant edge portion,
a flattening film is formed covering the end portion of the second insulating film and a portion of a top surface of the second insulating film, and
the metal pattern is formed on the flattening film and the top surface of the second insulating film spanning between the flattening film and the second insulating film.

11. The display device according to claim 9,
wherein in the frame region surrounding the cutout portion, an end portion of at least the second insulating film, from among the plurality of inorganic insulating films located lower than the third metal layer, is formed on the display region side of the variant edge portion, and
the metal pattern is formed on the resin layer and a top surface of the second insulating film spanning between the resin layer and the second insulating film.

12. The display device according to claim 1,
wherein in the frame region, a projection is formed surrounding the display region, and
the metal pattern is formed between the projection and the variant edge portion.

13. The display device according to claim 12,
wherein the projection includes a first projection surrounding the display region and a second projection surrounding the first projection, and
the metal pattern is formed between the second projection and the variant edge portion.

14. The display device according to claim 1,
wherein the resin layer is a polyimide resin layer.

15. The display device according to claim 1, further comprising:
a base substrate under the resin layer,
wherein, in plan view, the cutout portion has a concave shape in which an edge portion of the base substrate is recessed toward the display region.

16. A manufacturing method of a display device provided with a display region, a frame region surrounding the display region, and a cutout portion provided in the frame region, comprising:
forming a resin layer;
forming a plurality of inorganic insulating films on the resin layer;
forming a metal layer on and in contact with one inorganic insulating film from among the plurality of inorganic insulating films; and
forming a metal pattern by patterning the metal layer conforming to at least a portion of a shape of the cutout portion, in the frame region between a variant edge portion of the display device forming the cutout portion and the display region, the display region being provided with a plurality of subpixels; and
the metal pattern is electrically unconnected to any wiring lines.

* * * * *